United States Patent
Arisa

(10) Patent No.: US 6,426,275 B1
(45) Date of Patent: Jul. 30, 2002

(54) METHOD FOR MANUFACTURING SEMICONDUCTOR CHIPS USING PROTECTING PRICING AND SEPARATING SHEETS

(75) Inventor: Shigeharu Arisa, Mitaka (JP)

(73) Assignee: Tokyo Seimitsu Co., Ltd., Mitaka (JP)

( * ) Notice: Subject to any disclaimer, the term of this patent is extended or adjusted under 35 U.S.C. 154(b) by 0 days.

(21) Appl. No.: 09/632,186

(22) Filed: Aug. 3, 2000

(30) Foreign Application Priority Data

Aug. 3, 1999 (JP) .......................................... 11-220485

(51) Int. Cl.$^7$ ........................ H01L 21/46; H01L 21/78; H01L 21/301

(52) U.S. Cl. ...................... 438/464; 438/460; 438/463; 438/963

(58) Field of Search ................................ 438/464, 463, 438/460, 963

(56) References Cited

U.S. PATENT DOCUMENTS

| | | | | |
|---|---|---|---|---|
| 5,637,395 A | * | 6/1997 | Uemura et al. | 428/343 |
| 5,942,578 A | * | 8/1999 | Noguchi et al. | 525/228 |
| 5,960,260 A | * | 9/1999 | Umehara et al. | 438/118 |
| 6,040,204 A | * | 3/2000 | Herden et al. | 438/109 |
| 6,342,434 B1 | | 1/2002 | Miyatomo et al. | 438/464 |

FOREIGN PATENT DOCUMENTS

| | | |
|---|---|---|
| JP | 5-29455 | 5/1993 |
| JP | 5-63077 | 12/1993 |
| JP | 11-204551 | 7/1999 |
| WO | WO 97/21243 | * 6/1997 |

\* cited by examiner

Primary Examiner—Michael J. Sherry
Assistant Examiner—Asok Kumar Sarkar
(74) Attorney, Agent, or Firm—Nixon Peabody LLP; David S. Safran

(57) ABSTRACT

The reverse of a wafer is processed after adhering a protecting sheet and a reinforcing plate to the obverse of a wafer. The wafer is mounted on a frame for dicing via a dicing sheet and diced. Then, the protecting sheet is separated from the wafer after irradiating the wafer with ultraviolet light.

6 Claims, 4 Drawing Sheets

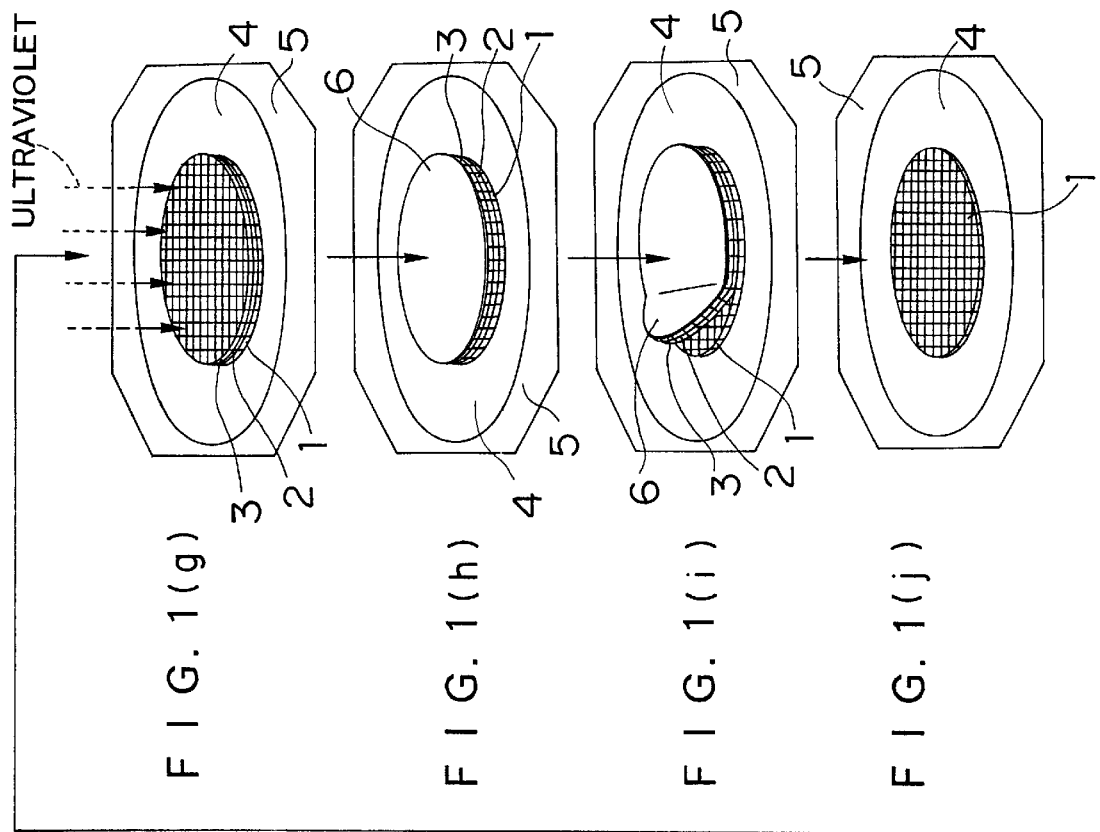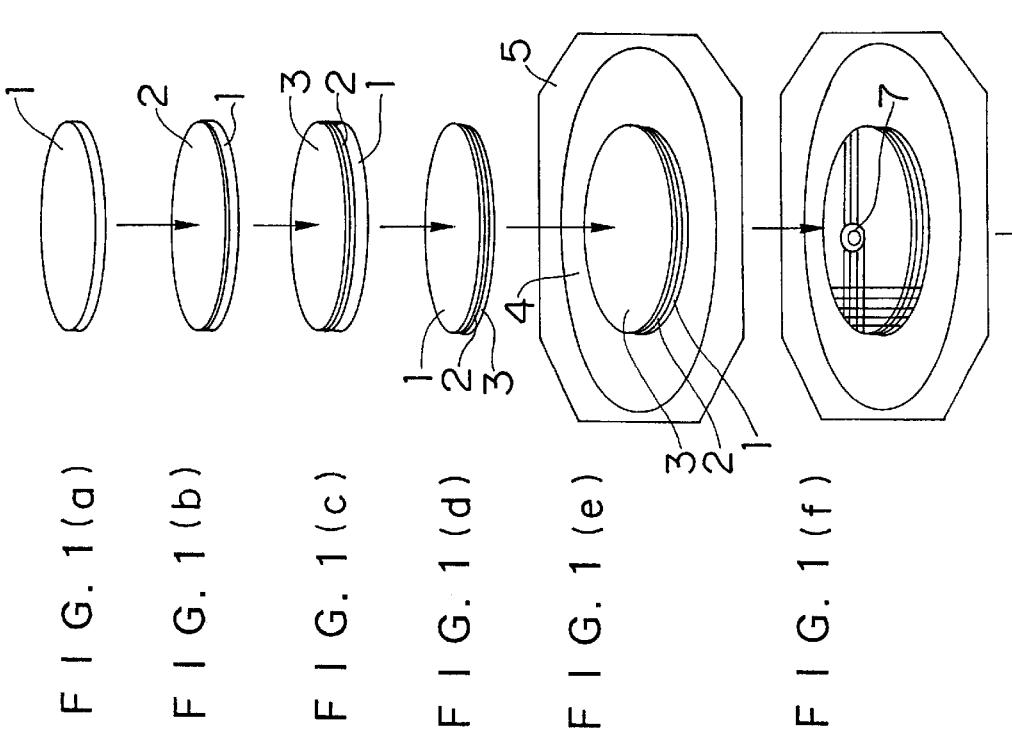

METHOD FOR MANUFACTURING SEMICONDUCTOR CHIPS USING PROTECTING PRICING AND SEPARATING SHEETS

BACKGROUND OF THE INVENTION

1. Field of the Invention

The present invention relates to a method for manufacturing semiconductor chips, particularly to a method for processing a semiconductor wafer to be extremely thin and dicing the semiconductor wafer into chips.

2. Description of Related Art

FIG. 3 is a flow chart showing a conventional chip manufacturing process. A plurality of semiconductor devices such as ICs are formed together on the obverse of a wafer and are individually inspected, and the wafer is then diced with a dicing saw to separate the devices. The semiconductor devices for IC cards are required to be thin, and in that case the reverse of the wafer is ground by a back grinder so as to make the wafer in a desired thickness before dicing it into the separate devices.

Before the reverse of the wafer is ground, a protecting sheet is adhered on the obverse of the wafer to protect the semiconductor devices, which have been formed on the obverse, from damages and contamination. After the reverse of the wafer is processed, the protecting sheet is peeled from the obverse of the wafer. Then, a dicing sheet is adhered on the reverse of the wafer, and the wafer is mounted on a frame for dicing so as to be diced.

The wafer whose reverse has been processed is thin and is extremely apt to be broken; thus, the wafer is often damaged when treating the wafer or adhering the dicing sheet on the wafer.

In order to overcome the above-mentioned problem, Japanese patent application laid-open Nos. 5-29455 and 5-63077 disclose methods wherein the dicing sheet is adhered on the reverse of the wafer after the reverse of the wafer is ground before the protecting sheet is peeled from the obverse, and then the protecting sheet is peeled from the obverse and the wafer is diced, so that the thin wafer alone is not treated.

Still, as even thinner wafers have required such as of 30 $\mu$m to 50 $\mu$m, although the dicing sheet is adhered on the reverse of the wafer, the wafer is damaged as shown in FIG. 4 when the protecting sheet is removed. FIG. 4 is a view of the conventional chip manufacturing process, which shows a state where the protecting sheet is separated from the obverse of the wafer after the reverse of the wafer is processed, and also shows that the wafer is partially broken. This occurs because of the fact that the stress is unevenly distributed in the wafer when removing the protecting sheet, and the stress concentrates at the frailest portion of the wafer.

SUMMARY OF THE INVENTION

The present invention has been developed in view of the above-described problems, and has as its object the provision of a process for manufacturing chips of high quality in which, a wafer that can have a large warp and is easy to be broken can be treated when making the final thickness of the wafer extremely thin by a reverse face processing and dicing the wafer into chips, and moreover breakage of the wafer due to concentration of stress is avoided by evenly distributing the stress to the wafer when removing the protecting sheet.

In order to achieve the above-described objects, the present invention is directed to a method for manufacturing a plurality of chips from a wafer, a plurality of semiconductor devices being formed on an obverse of the wafer, comprising the steps of: adhering a protecting sheet with an adhesive on the obverse of the wafer; performing, with respect to a reverse of the wafer, at least one of grinding, polishing, and etching; adhering a dicing sheet on the reverse of the wafer and mounting the wafer on a dicing frame; dicing the wafer with a dicing saw; hardening the adhesive; adhering a separating sheet for separating the protecting sheet over a top face of the protecting sheet; and separating the protecting sheet from the obverse of the wafer by separating the separating sheet from the wafer.

Preferably, the adhesive is an ultraviolet-setting type adhesive; and the obverse of the wafer is irradiated with ultraviolet light in the hardening step. Alternatively, the adhesive is a heat-sensitive type adhesive; and temperature of the wafer is controlled to harden the adhesive in the hardening step.

Moreover, in order to achieve the above-described objects, the present invention is directed to a method for manufacturing a plurality of chips from a wafer, a plurality of semiconductor devices being formed on an obverse of the wafer, comprising the steps of: adhering a protecting sheet with a first adhesive on the obverse of the wafer; adhering a reinforcing plate with a second adhesive on a top face of the protecting sheet; performing, with respect to a reverse of the wafer, at least one of grinding, polishing, and etching; adhering a dicing sheet on the reverse of the wafer and mounting the wafer on a dicing frame; dicing the wafer with a dicing saw; hardening the first adhesive; adhering a separating sheet for separating the protecting sheet over a top face of the reinforcing plate; and separating the protecting sheet and the reinforcing plate from the obverse of the wafer by separating the separating sheet from the wafer.

Preferably, the first adhesive is an ultraviolet-setting type adhesive; the second adhesive is not the ultraviolet-setting type adhesive; the reinforcing plate is made of an ultraviolet light transmissible material; and the obverse of the wafer is irradiated with ultraviolet light in the hardening step. Alternatively, the first adhesive is a heat-sensitive type adhesive; the second adhesive is not the heat-sensitive type adhesive; and temperature of the wafer is controlled to harden the first adhesive in the hardening step.

According to the present invention, the wafer is treated in the state that the protecting sheet is adhered on the obverse of the wafer, or the protecting sheet and the reinforcement sheet are adhered on the obverse of the wafer, or the dicing sheet is adhered on the reverse of the wafer and the wafer is mounted on the frame for dicing; hence a large warp, if any, of the extremely thin wafer can be corrected, and the wafer is treated with reinforcement.

The wafer is diced while the protecting sheet is adhered on the obverse of the wafer.

Further, since the protecting sheet and the reinforcing plate are separated after the wafer is diced into separate chips by dicing, the distribution of the stress to the wafer at the separation is uniform, and thus a partial concentration of the stress to the wafer does not occur.

Furthermore, the adhesive of the protecting sheet is hardened by the irradiation of the ultraviolet light or by the temperature control before separating the protecting sheet from the wafer so as to weaken the adhesive, whereby the wafer at the time of separating the protecting sheet can be even more effectively protected.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 1(a)–1(j) are views schematically showing a manufacturing process according to an embodiment of the present invention;

DETAILED DESCRIPTION OF THE PREFERRED EMBODIMENT

Hereunder a preferred embodiment according to a method for manufacturing semiconductor chips of the present invention will be described in detail with reference to the accompanying drawings.

Figure 2:
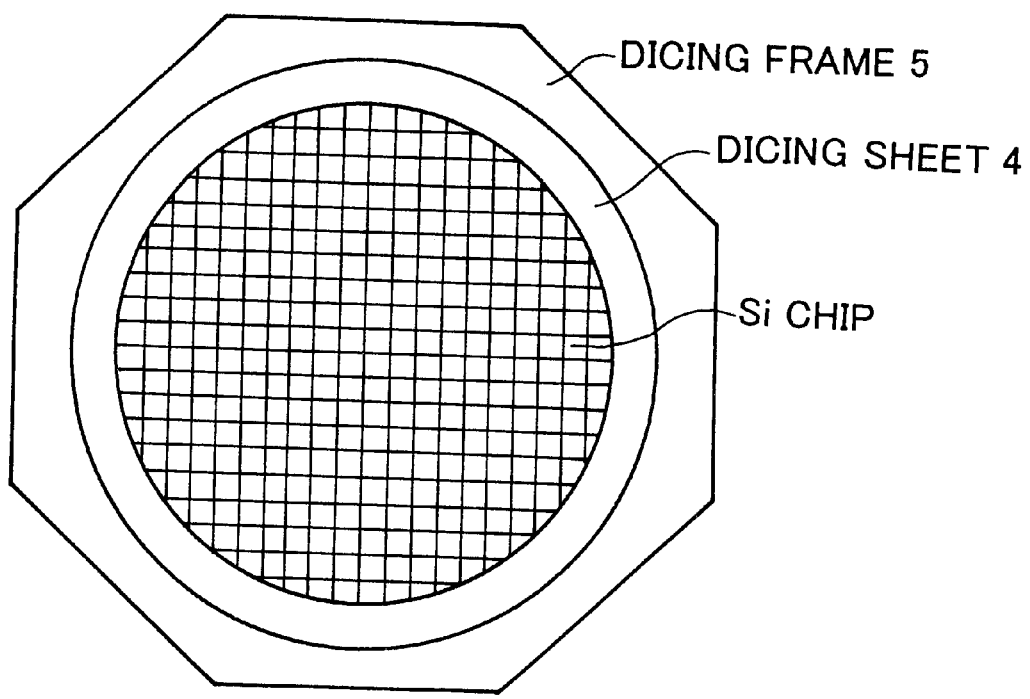
FIG. 2 is a view showing a state where a wafer is cut into separate chips and the protecting sheet is separated from the obverse of the wafer according to the manufacturing process of the present invention.
Figure 3:
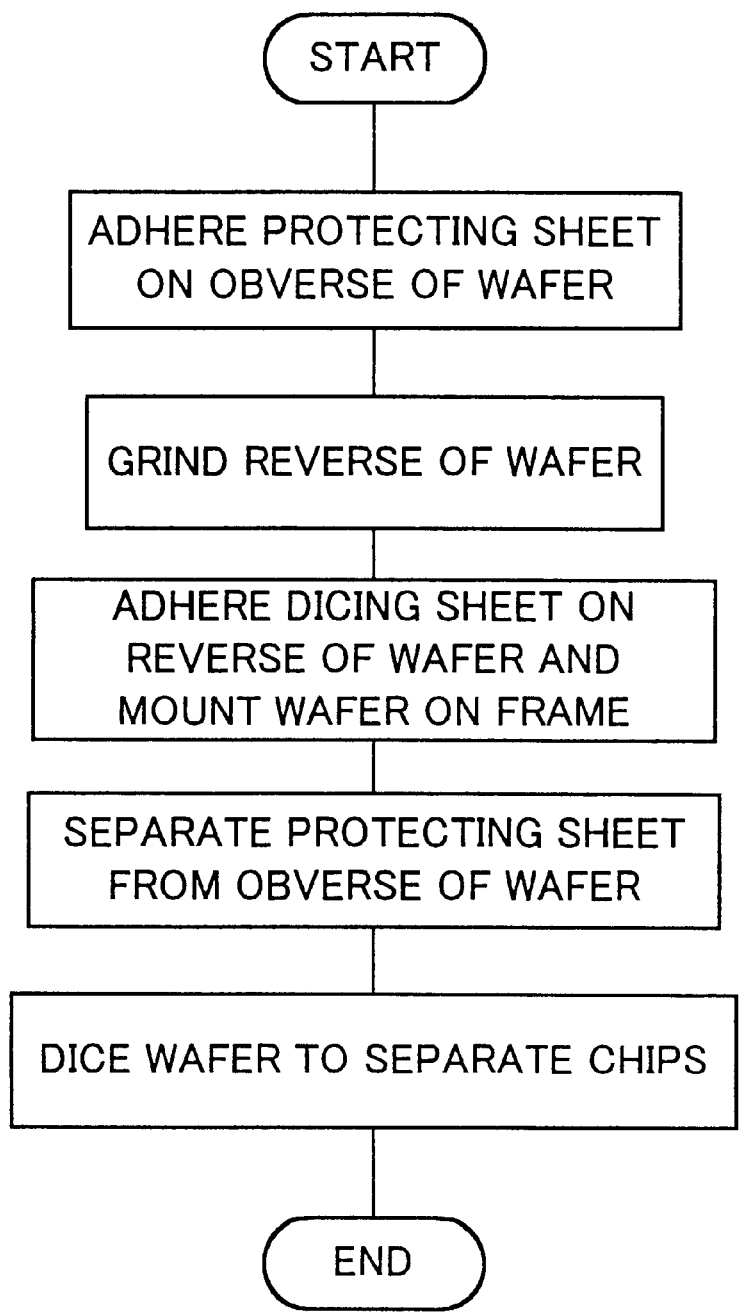
FIG. 3 is a flow chart showing a conventional chip manufacturing process.
Figure 4:
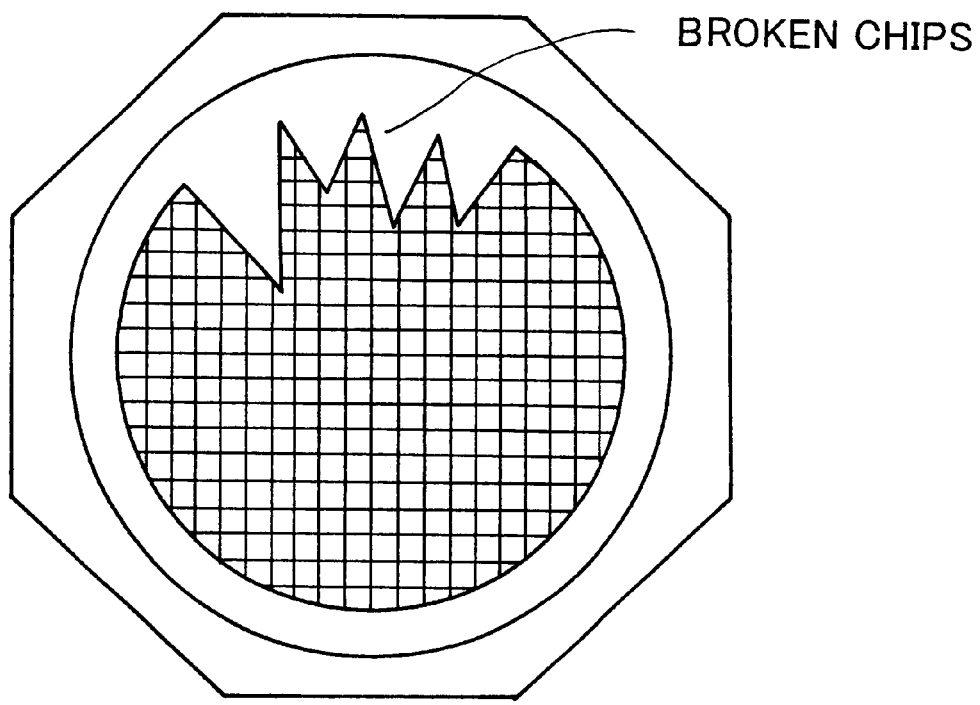
FIG. 4 is a view of the conventional chip manufacturing process, which shows a state where the protecting sheet is separated from the obverse of the wafer after the reverse of the wafer is processed, and also shows that the wafer is partially broken.

FIGS. 1(a)–1(j) are views schematically showing a semiconductor chip manufacturing process according to an embodiment of the present invention. FIG. 2 is a view showing a state where a wafer is cut into individual chips and a protecting sheet is separated from an obverse of the wafer by using the manufacturing process of the present invention.

FIG. 1(a) shows a wafer 1. As shown in FIG. 1(b), a protecting sheet 2 is adhered on the obverse, on which semiconductor devices have been formed, of the wafer 1. The protecting sheet 2 has ultraviolet-setting type adhesive on its adhering face. Then, a reinforcing plate 3 that is made of ultraviolet light transmissible material and has non-ultraviolet-setting type adhesive is adhered on the protecting sheet 2 as shown in FIG. 1(c).

Next, the wafer 1 is turned over to have the reverse up as shown in FIG. 1(d), and the reverse of the wafer 1 is ground from above to a predetermined thickness by a grinding wheel (not shown). Then, the wafer is polished by a polishing pad (not shown) and a damaged layer, which is generated by the grinding, is removed. In this state, the thickness of the wafer 1 is already at most 200 μm, ones particularly thin are 30 μm to 50 μm thin. However, the protecting sheet 2 and the reinforcing plate 3 are adhered on the wafer 1, so that the wafer 1 can be easily treated without any damage.

After that the wafer 1 is turned over again by 180 degree, and a dicing sheet 4 is adhered on the reverse of the wafer 1 and a frame 5 for dicing is adhered on the dicing sheet 4. Thus, the wafer 1 is mounted on the frame 5 for dicing as shown in FIG. 1(e).

The wafer 1 is diced at this state with a dicing saw 7 together with the protecting sheet 2 and the reinforcing plate 3, so that the wafer 1 is diced into separate chips as shown in FIG. 1(f).

Then, the wafer 1 is irradiated with ultraviolet light from its above as shown in FIG. 1(g). The ultraviolet light transmits through the reinforcing plate 3 and the protecting sheet 2 and hardens the adhesive, which is ultraviolet-setting type, of the protecting sheet 2 so as to weaken the adhesion power of the adhesive.

Next, a separating sheet 6 is adhered over the top face of the reinforcing plate 3 as shown in FIG. 1(h) in order to peel off the protecting sheet 2 and the reinforcing plate 3 from the wafer 1, and the protecting sheet 2 and the reinforcing plate 3 are separated from the obverse of the wafer 1 as shown in FIG. 1(i) by removing the separating sheet 6 the wafer 1.

By the above-described process, the wafer 1 is mounted on the frame 5 for dicing through the dicing sheet 4 while being diced into separate chips, and the protecting sheet 2 is removed. The wafer 1 is at a stand-by state for the next chip mounting process as shown in FIG. 1(j) without damage.

As presented above, the preferred embodiment of the manufacturing process for the semiconductor wafer according to the present invention is described. If the wafer 1 has a sufficient final thickness, the reinforcing plate 3 may be eliminated. Although the ultraviolet-setting type adhesive is mentioned as adhesive for the protecting sheet 2, heat-setting type adhesive, or side chain crystallizing polymer adhesive, which transforms between a crystallized phase and an uncrystallized phase by the predetermined temperature boundary, and the like may be used for the protecting sheet 2. When using such heat-sensitive adhesive for the protecting sheet 2, non-heat-sensitive type adhesive is used for the reinforcing plate 3, and the adhesive power of the protecting sheet 2 can be controlled by temperature control instead of irradiating the wafer 1 with the ultraviolet light.

Although needless to mention, the utility of the process of the present invention is not limited for a semiconductor wafer; the process may be used for chip manufacturing process for brittle material of various types.

As presented above, according to the manufacturing process for the semiconductor chip, the wafer is treated while the protecting sheet is adhered on the obverse of the wafer, or while the protecting sheet and the reinforcing plate are adhered on the obverse of the wafer, or while the dicing sheet is adhered on the reverse of the wafer and the wafer is mounted on the frame for dicing; thus the extremely thin wafer is easily and steadily treated without being broken.

Further, the wafer is diced in a state where the obverse of the wafer is covered with the protecting sheet, hence dust is prevented from adhering to the obverse of the wafer.

Further, the protecting sheet is separated from the wafer after dicing the wafer into separate chips by dicing; hence the distribution of the stress to the wafer during the separation is made uniform, and the wafer is prevented from breakage due to stress concentration.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method for manufacturing a plurality of chips from a wafer, a plurality of semiconductor devices being formed on an obverse of the wafer, comprising the steps in the following order:

adhering a protecting sheet with an adhesive on the obverse of the wafer; then performing, with respect to a reverse of the wafer, at least one of grinding, polishing, and etching; then adhering a dicing sheet on the reverse of the wafer and mounting the wafer on a dicing frame; then dicing the wafer and the protecting sheet adhered to the wafer into a plurality of pieces with a dicing saw while the dicing sheet is adhered to the wafer; then hardening the adhesive so as to weaken adherence between the pieces of the protective sheet and the obverse of the wafer; then adhering a separating sheet, for removal of the pieces of the protecting sheet which has been cut by the dicing saw, over a top face of the protecting sheet; and then removing all of the pieces of the protecting sheet from the obverse of the pieces of the wafer together with the separating sheet while the pieces of the wafer remain adhered to the dicing sheet.

2. The method as defined in claim 1, wherein:

the adhesive is an ultraviolet-setting type adhesive; and in the hardening step, the obverse of the wafer is irradiated with ultraviolet light.

3. The method as defined in claim 1, wherein:

the adhesive is a heat-sensitive type adhesive; and in the hardening step, temperature of the wafer is controlled to harden the adhesive.

4. A method for manufacturing a plurality of chips from a wafer, a plurality of semiconductor devices being formed on an obverse of the wafer, comprising the steps in the following order:

adhering a protecting sheet with a first adhesive on the obverse of the wafer; then adhering a reinforcing plate with a second adhesive on a top face of the protecting sheet; then performing, with respect to a reverse of the wafer, at least one of grinding, polishing, and etching; then adhering a dicing sheet on the reverse of the wafer and mounting the wafer on a dicing frame; then dicing the wafer, with the protecting sheet and the reinforcing plate, into a plurality of pieces with a dicing saw; then hardening the first adhesive so as to weaken adherence between the pieces of the protective sheet and the obverse of the pieces of the wafer; then adhering a separating sheet, for removal of the pieces of the protecting sheet which has been cut by the dicing saw, over a top face of the reinforcing plate; and then removing all of the pieces of the protecting sheet and the reinforcing plate from the obverse of the pieces of the wafer together with the separating sheet while the pieces of the wafer remain adhered to the dicing sheet.

5. The method as defined in claim 4, wherein:

the first adhesive is an ultraviolet-setting type adhesive;

the second adhesive is not the ultraviolet-setting type adhesive;

the reinforcing plate is made of an ultraviolet light transmissible material; and in the hardening step, the obverse of the wafer is irradiated with ultraviolet light.

6. The method as defined in claim 4, wherein:

the first adhesive is a heat-sensitive type adhesive;

the second adhesive is not the heat-sensitive type adhesive; and in the hardening step, temperature of the wafer is controlled to harden the first adhesive.

* * * * *